(12) United States Patent
Chen et al.

(10) Patent No.: US 7,117,133 B2
(45) Date of Patent: Oct. 3, 2006

(54) PHOTONIC BAND GAP STRUCTURE SIMULATOR

(75) Inventors: Chiping Chen, Needham, MA (US); Michael A. Shapiro, Marblehead, MA (US); Evgenya I. Smirnova, Somerville, MA (US); Richard J. Temkin, Newton, MA (US); Jagadishwar R. Sirigiri, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 548 days.

(21) Appl. No.: 10/171,725

(22) Filed: Jun. 14, 2002

(65) Prior Publication Data

US 2003/0023417 A1 Jan. 30, 2003

Related U.S. Application Data

(60) Provisional application No. 60/298,434, filed on Jun. 15, 2001.

(51) Int. Cl.
*G06F 17/50* (2006.01)
(52) U.S. Cl. ............................... 703/2; 703/13; 703/17
(58) Field of Classification Search .................... 703/2, 703/13, 17; 385/39, 126; 333/234; 359/248; 216/48, 2
See application file for complete search history.

(56) References Cited

U.S. PATENT DOCUMENTS

| | | | |
|---|---|---|---|
| 5,365,541 A * | 11/1994 | Bullock | 372/99 |
| 5,751,466 A * | 5/1998 | Dowling et al. | 359/248 |
| 5,973,823 A | 10/1999 | Koops et al. | |
| 6,028,693 A * | 2/2000 | Fork et al. | 359/248 |
| 6,134,043 A | 10/2000 | Johnson et al. | |
| 6,274,293 B1 * | 8/2001 | Gupta et al. | 430/315 |
| 6,285,020 B1 | 9/2001 | Kim et al. | |
| 6,452,713 B1 | 9/2002 | White | |
| 6,535,665 B1 | 3/2003 | Kim et al. | |
| 6,538,621 B1 | 3/2003 | Sievenpiper et al. | |
| 6,538,794 B1 * | 3/2003 | D'Aguanno et al. | 359/279 |
| 6,603,558 B1 | 8/2003 | Murakowski et al. | |
| 6,801,107 B1 * | 10/2004 | Chen et al. | 333/234 |
| 6,801,691 B1 * | 10/2004 | Berini | 385/39 |
| 6,845,204 B1 * | 1/2005 | Broeng et al. | 385/126 |
| 2002/0096492 A1 * | 7/2002 | George et al. | 216/48 |

OTHER PUBLICATIONS

Biller et al., "Poisson/Superfish User's Manual," *Los Alamos Accelerator Code Group* (LANL, 1996), Table of Contents only.

(Continued)

*Primary Examiner*—Thai Phan
(74) *Attorney, Agent, or Firm*—Gauthier & Connors LLP

(57) ABSTRACT

A system and method for designing photonic band gap structures. The system and method provide a user with the capability to produce a model of a two-dimensional array of conductors corresponding to a unit cell. The model involves a linear equation. Boundary conditions representative of conditions at the boundary of the unit cell are applied to a solution of the Helmholtz equation defined for the unit cell. The linear equation can be approximated by a Hermitian matrix. An eigenvalue of the Helmholtz equation is calculated. One computation approach involves calculating finite differences. The model can include a symmetry element, such as a center of inversion, a rotation axis, and a mirror plane. A graphical user interface is provided for the user's convenience. A display is provided to display to a user the calculated eigenvalue, corresponding to a photonic energy level in the Brilloin zone of the unit cell.

18 Claims, 14 Drawing Sheets

OTHER PUBLICATIONS

Gelvich et al., "The New Generation of High-Power Multiple-Beam Klystrons," *IEEE Transactions on Microwave Theory and Techniques*, vol. 41, p. 15 (1993).

Plasma Science and Fusion Center—MIT "Gyrotron Oscillator with a Photonic Bandgap Resonator" (2001).

Radisic et al., "Broad-Band Power Amplifier Using Dielectric Photonic Bandgap Structure," *IEEE Microwave and Guided Wave Letters*, vol. 8, p. 13 (1998).

Shapiro et al., "Improved Photonic Bandgap Cavity and Metal Rod Lattices for Microwave and Millimeter Wave Applications," *IEEE MTT-S Digest*, p. 581 (2000).

Shapiro et al., "Photonic Bandgap Structure Based Accelerating Cell," *Proceedings of the 1999 Particle Accelerator Conference*, p. 833 (1999).

Shapiro et al., "Photonic Bandgap Structures—Oversized Circuits for Vacuum Electron Devices," *IEEE Electron Devices Society* (2000).

Shapiro et al., "Photonic Bandgap Structures: Oversized Circuits for Vacuum Electron Devices," *Presented at IVEC* (2000).

Sirigiri et al., "A Photonic Bandgap Resonator Gyrotron," *Phys. Rev. Lett.*, vol. 86, p. 5628 (2001).

Sirigiri, "Gyrotron Research Scenario," *Varanasi* (2001).

Sirigiri et al., "High Power W-Band Quasioptical Gyrotron Research at MIT," *Varanasi* (2001).

Sirigiri, "Results on Gyrotron Research with Overmoded Resonators," *MURI Student Teleconference* (2001).

Smith et al., "Studies of a Metal Photonic Bandgap Cavity," *AIP Conference Proceedings 335*, p. 761, (1995).

Sun et al., "Grid Oscillators with Selective-Feedback Mirrors," *IEEE Transactions on Microwave Theory and Techniques*, vol. 46, p. 2324 (1998).

UCD Plasma Physics and Millimeter Wave Technology Group "Innovative Vacuum Electronics Brief Program Description," http://tempest.engr.ucdavis.edu/muri99/overview.html (2 pgs.).

Patent Cooperation Treaty (PCT) International Search Report; International application No. PCT/US02/18750; mailed Oct. 29, 2003.

Shapiro, M. A. et al., "17 GHz photonic band gap cavity with improved input coupling," Physical Review Special Topics—Acceleration and Beams, 4, 2001, pp. 042001/1-042001/6.

Smirnova, E. I. et al., "Simulation of photonic band gaps in metal rod lattices for microwave applications," Journal of Applied Physics, 91, No. 3, Feb. 1, 2002, pp. 960-968.

* cited by examiner

PHOTONIC BAND GAP STRUCTURE SIMULATOR

CROSS-REFERENCE TO RELATED APPLICATIONS

This application claims the benefit of U.S. provisional patent application Ser. No. 60/298,434, filed Jun. 15, 2001, which application is incorporated herein in its entirety by reference. This application also incorporates by reference the entire disclosure of co-pending U.S. patent application Ser. No. 10/037,661, filed Jan. 4, 2002, entitled "Vacuum Electron Device With Photonic Bandgap Structure And Method Of Use Thereof" (hereinafter "the '661 application"), which application is subject to assignment to the same assignee of the present application.

GOVERNMENT RIGHTS

This invention was made with government support under Grant No. F49620-99-0197 and Grant No. F49620-01-0007 awarded by the United States Air Force Office of Scientific Research, and Grant No. DE-FG02-95ER40919 awarded by the Department of Energy. The government may have certain rights in the invention.

FIELD OF THE INVENTION

This invention relates generally to modeling electronic structures devices. More particularly, the invention relates to modeling electronic structures that comprise a photonic bandgap (PBG).

BACKGROUND OF THE INVENTION

Since the pioneering work of Yablonovitch in the late 1980s, photonic band gap (PBG) structures have emerged as a growth area for research and development. The existence of local and global photonic band gaps in periodic dielectric and/or metallic structures has enabled physicists and engineers to find novel areas of applications. Previously proposed or demonstrated applications of dielectric PBG structures range from the controlling of spontaneous emission in optical devices, to the applications of photonic crystals in semiconductor lasers and photovoltaic cells, to the omniguide formed with alternating dielectric layers. While initial studies of PBG structures were primarily focused on dielectric PBG structures, metallic PBG structures, as well as dielectric-metallic hybrids, have received considerable attention recently, because of their applications in rf accelerators and high-power microwave vacuum electron devices, and in the transmission and filtering of microwaves. In particular, single-mode PBG rf accelerating cells have been demonstrated by creating a single defect in PBG lattices, and a PBG resonator gyrotron has been demonstrated experimentally with high mode selectivity.

There are two important aspects that need to be studied in order to facilitate the design of metallic PBG devices. One involves the wave propagation in the bulk of the metallic PBG structure, and the other concerns the wave interaction with the interface between the metallic PBG structure and vacuum, e.g., mode confinement in a metallic PBG cavity. For analyses of metallic PBG cavities formed by single or multiple defects in the PBG structure, finite-element codes such as SUPERFISH and HFSS are ideally suited. The SUPERFISH eigenmode solver was written at the Los Alamos National Laboratory (LANL), and is available at no cost from the web site http://laacg1.lanl.gov/laacg/services/psugall.html. Ansoft High Frequency Structure Simulator (HFSS) is a commercially-available 3D electromagnetic code. For studies of wave propagation in the bulk of metallic PBG structures, on the other hand, the generalized Rayleigh expansion method, plane-wave expansion method, and finite-difference time-domain scheme have been used.

One of the most important and computationally challenging problems is the calculation of the global photonic band gaps in metallic lattices. While a number of papers have dealt with the global photonic band gaps in dielectric lattices, results for a metallic lattice have only been obtained for TM modes in the lowest gap of a square lattice.

SUMMARY OF THE INVENTION

In one embodiment, a vacuum electron device with a PBG structure can include a PBG structure that is capable of overmoded operation, as well single mode operation. PBG structures are, in some embodiments, two-dimensional (2D) or three-dimensional (3D) periodic structures with restricted transmission bands at certain frequencies. Such vacuum electron devices include gyrotron oscillators and amplifiers, traveling wave tubes, traveling wave tube amplifiers, klystrons, microwave tubes, and the like. The device with the PBG structure can include a single cavity, or the device can include a plurality of cavities. The PBG structure permits the device to operate more efficiently.

PBG cavities offer several advantages, including, but not limited to, an oversized structure that offers ease of fabrication; a structure that is suitable for high frequency operation; and a structure that can include an absorbing peripheral boundary. PBG structures can be used to provide higher order mode discrimination. Coupling into a PBG cavity can be performed using a variety of coupling schemes, and the coupling can be optimized. Coupling into a PBG cavity in some embodiments involves distributed coupling. Distributed coupling results in relatively small disturbance of the resonant mode frequency when compared with conventional hole coupling.

In the design and construction of suitable PBG cavities, there has not been a convenient system or method for deducing the appropriate structure or structures for use in a particular situation. The necessary calculations are complex, and the physics is not always intuitive. Many design choices are potentially possible, including different geometries, and the use of different materials, such as metals, dielectrics, and combinations of metals and dielectrics. The present invention provides systems and methods for performing the necessary design calculations in a straightforward manner, to obtain a suitable PBG structure. The present invention permits the PBG designer and constructor to design and construct (and later operate) a PBG structure with confidence that it will work as intended. As is understood in the arts relating to building prototypes, the construction of a prototype can be expensive and time consuming. The present invention allows the designer to consider alternative designs to accomplish a particular technical effect or result, such as propagating a particular frequency of radiation under specified conditions, performing filtering, performing mixing, or performing switching. The designer can then perform design calculations according to the principles of the invention and can then make an informed election as to which of the designs that provide a suitable structure will be constructed, with the expectation that the PBG structure so constructed will perform the intended function.

In one aspect, the invention relates to a system for designing a photonic bandgap structure. The system comprises a modeling module representing components of a photonic bandgap structure as a linear equation corresponding to a unit cell, and a boundary condition module representing a boundary condition for the unit cell. The boundary condition is applied to a solution of a Helmholtz equation defined for the unit cell. The system also comprises an approximation module approximating the linear equation using a Hermitian matrix, and a computation module calculating an eigenvalue of the Helmholtz equation in a Hermitian matrix form for the unit cell. In one embodiment, the system further comprises a design module constructing a photonic bandgap structure in response to the calculated eigenvalue.

In one embodiment, the computation module calculates eigenvalues by calculating finite differences. In one embodiment, the unit cell has a symmetry element comprising a selected one of a center of inversion, a rotation axis and a mirror plane.

In one embodiment, the system further comprises a graphical user interface module for providing a graphic user interface for user interaction with the modeling module.

In one embodiment, the system further comprises a display module displaying a calculated eigenvalue result to a user. The result corresponds to a photonic energy level in a Brillouin zone of the unit cell.

In another aspect, the invention features a system for designing a photonic bandgap structure. The system comprises a modeling means for representing components of a photonic bandgap structure as a linear equation corresponding to a unit cell, a boundary condition means for representing a boundary condition for the unit cell, an approximation means for approximating the linear equation using a Hermitian matrix, and a computation means for calculating an eigenvalue of the Helmholtz equation in a Hermitian matrix form for the unit cell. The boundary condition is applied to a solution of a Helmholtz equation defined for the unit cell.

In one embodiment, the system further comprises a design means for constructing a photonic bandgap structure in response to the calculated eigenvalue.

In one embodiment, the computation means calculates eigenvalues by calculating finite differences. In one embodiment, the unit cell has a symmetry element comprising a selected one of a center of inversion, a rotation axis and a mirror plane.

In one embodiment, the system further comprises a graphical user interface means for providing a graphic user interface for user interaction with the modeling means.

In one embodiment, the system further comprises a display means for displaying a calculated eigenvalue result to a user. The result corresponds to a photonic energy level in a Brillouin zone of the unit cell.

In still another aspect, the invention relates to a method of designing a photonic bandgap structure. The method comprises the steps of representing components of a photonic bandgap structure as a linear equation corresponding to a unit cell, representing a boundary condition for the unit cell, approximating the linear equation using a Hermitian matrix corresponding to the unit cell, and calculating an eigenvalue of the Helmholtz equation by solving the Hermitian matrix equation. The boundary condition is applied to a solution of a Helmholtz equation defined for the unit cell.

In one embodiment, the step of calculating an eigenvalue comprises calculating finite differences. In one embodiment, the step of representing components comprises representing components of a photonic bandgap structure as a plurality of linear equations corresponding to a unit cell having a symmetry element selected from a center of inversion, a rotation axis and a mirror plane.

In one embodiment, the method further comprises the step of accepting from a user parameters of the photonic bandgap structure using a graphic user interface.

In one embodiment, the method further comprises the step of displaying a result of a design calculation to a user corresponding to a photonic energy level in a Brillouin zone of the unit cell.

In a further aspect, the invention relates to a photonic bandgap structure fabricated in accordance with the result of the method described above.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

A brief description of a vacuum electron device having a PBG structure, based on the disclosure in the '661 application, is presented as introductory material to acquaint the reader with the features of PBG structures. The description of the systems and methods used to perform simulations useful in designing and analyzing such PBG structures follows.

A PBG structure, which is a periodic array of spatially varying dielectric or metallic structures (or combinations of metallic and dielectric structures), was first described by Yablonovitch. In recent years, numerous advances have improved the understanding of the theory of PBG structures. This has led to new applications in passive devices for guiding and confinement of electromagnetic radiation. The use of PBG structures in both microwave and optical devices has primarily been limited to passive devices such as waveguides and filters, though some applications in active devices have been reported.

Figure 1A:
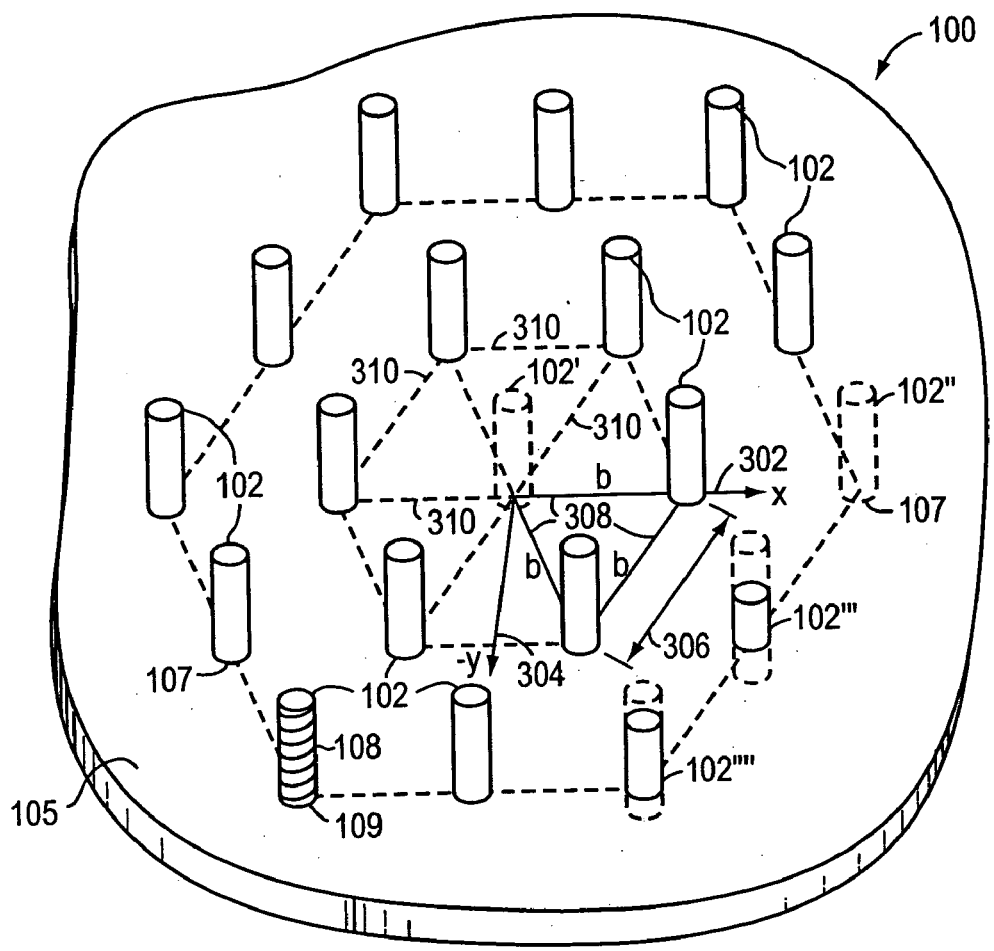
FIG. 1A is a drawing showing a perspective view of an illustrative embodiment in the form of a triangular (or hexagonal) symmetry photonic bandgap cavity comprising a plurality of movable and temperature-controlled members.

FIG. 1A is a drawing showing a perspective view of an illustrative embodiment in the form of a triangular (or hexagonal) symmetry photonic bandgap cavity 100 comprising a plurality of movable and temperature-controlled members 102, disposed in a supporting structure, such as baseplate 105. The baseplate 105 can be made of metal. In one embodiment, the members 102 are metallic right circular cylinders. In other embodiments, the members 102 are rectilinear structures such as fingers having polygonal cross section, for example, triangles, squares, hexagons, octagons, and the like. A two-dimensional (2D) PBG cavity 100 made of a lattice (or array) of members 102 with a defect (i.e., a missing member 102' or several missing members 102) in the center is used in a variety of microwave tubes, such as klystrons and coupled cavity traveling wave tubes (TWT). For the configuration shown in FIG. 1A, a defect mode of the lattice is used as an operating mode. The defect is provided by the deliberate removal (or deliberate failure to provide) a member 102', shown in phantom, at one triangular vertex of the array. This defect mode is analogous to the $TM_{010}$ mode of a pill-box cavity. The advantage of the PBG cavity 100 is that only the operating mode is localized in the vicinity of the defect. Higher-order high-frequency modes penetrate through the rows of members 102 and therefore can be damped (or spilled over) without affecting the operating mode. Thus, this cavity 100 is capable of suppressing unwanted modes. In addition, the rf coupling into the operating mode is improved because the coupling is distributed over the members 102, yielding a more symmetric field distribution in comparison with direct waveguide coupling.

The PBG cavity 100 can be tuned, for example by removal or by partial withdrawal of individual members 102. The tuning can be simulated by computations, as discussed in greater detail below. In addition, the coupling of the cavity 100 can be adjusted to achieve critical coupling. Adjustments can include changes in the direction of propagation of the electromagnetic radiation relative to the geometry of the PBG, as well as changes in the number of members 102 present in the PBG and changes in the length of one or more members 102 within the PBG. The changes can be performed dynamically during the operation of the PBG, or the changes can be performed with the PBG in a non-operating condition, or both sequentially.

In particular, the illustrative embodiment shown in FIG. 1A comprises two hexagons of members 102 (e.g., metal rods or rectilinear fingers) surrounding the central defect (e.g., the missing member 102' in the center of the 2D array). In this embodiment, the innermost hexagon comprises six (6) members 102. The next hexagon comprises twelve (12) locations that are potentially the sites at which members 102 are present.

As can be seen in FIG. 1A, the majority of members 102 are rectilinear structures that extend a fixed distance above the baseplate 105. The member 102" has been withdrawn to the extent of substantially 100 percent of its length in the PBG (e.g. removed entirely), as indicated by the phantom 102" shown in outline. This withdrawal can be accomplished by moving the member 102 slidably through a bore 107 in the baseplate 105, and holding the member 102 in a specific position by clamping the member 102, for example with a set screw (not shown) that extends against the member 102 in the plane of the baseplate 105. Alternatively, the member 102 can have a thread 108 on its outer surface, which mates with an internally threaded bore 109 through the baseplate 105, so that the member 102 can be advanced into or withdrawn from the PBG by being rotated, thereby activating an axial motion as the screw thread 108 turns. The member 102''' has been withdrawn to the extent of approximately 66% of its extension in the PBG, while the member 102'''' has been withdrawn only a modest amount.

FIG. 1A further includes an illustrative diagram that shows the geometry of a triangular (or hexagonal) two-dimensional (2D) photonic bandgap lattice. In FIG. 1A, the directions of the x 302 and negative y 304 vectors defining the basis vectors of the two dimensional array are shown. Since the lattice or array of FIG. 1A is a triangular or hexagonal lattice, the distance between centers of adjacent rods 102 or fingers is the distance b 306, that is, the centers of three rods 102, here indicated as being connected by solid lines 308, form an equilateral triangle which is a triangular "unit cell" of the array. The dotted parallelepiped comprising dotted lines 310 located with one of its vertices at the origin (x=0, y=0) indicates the hexagonal "unit cell" of the lattice. One can recognize the hexagonal nature of the lattice by considering all of the locations of rods or rectilinear fingers other than the one at the origin. In this diagram, the x 302 axial direction corresponds to one of several possible vertex coupling directions, and the negative y 304 axial direction corresponds to one of several possible side coupling directions.

Figure 1B:
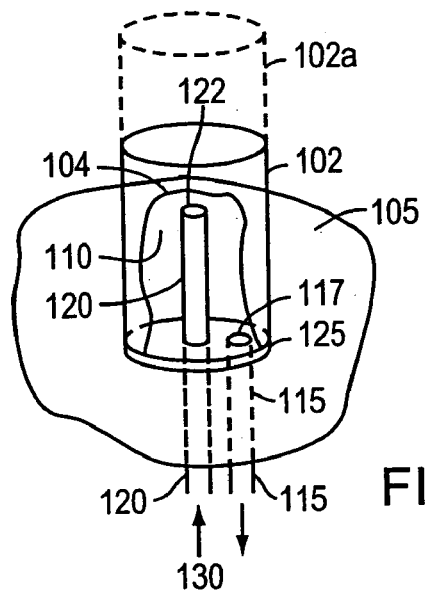
FIG. 1B is a drawing showing in cutaway cross-section a structure useful for controlling the temperature of movable members.

FIG. 1B is a drawing showing in cutaway cross-section a structure useful for controlling the temperature of movable members 102. The member 102 is shown in cutaway section, and plate 105 is indicated as a plane surface. The cutaway line 104 allows the viewer to see the interior of the member 102. The member 102 has interior surfaces or walls 110, and an interior upper surface, not seen. A tubulation 120, such as a hose, enters the interior of the member 102 through an opening in the bottom surface 125 of the member 102. Cooling fluid 130 provided by a source (not shown) flows up through tubulation 120 and exits its open end 122, flowing within the interior walls 110 of member 102 so as to control the temperature of the member 102 by conduction. The fluid 130 can be water. The fluid temperature is regulated by standard means to provide adequate heating or cooling to control the temperature of the member 102. A tubulation 115 for removing the fluid from the interior of the member 102 is provided. The tubulation 115 penetrates the bottom surface 125 of the member 102 to provide egress at an opening 117 defined within the bottom surface 125 from the interior volume within the member 102. As can be seen with regard to the member 102 and the phantom 102a, the member 102 can be both movable and temperature-controlled. Temperature control is useful to permit operation of the PBG structure at high power without damage.

Figure 2B:
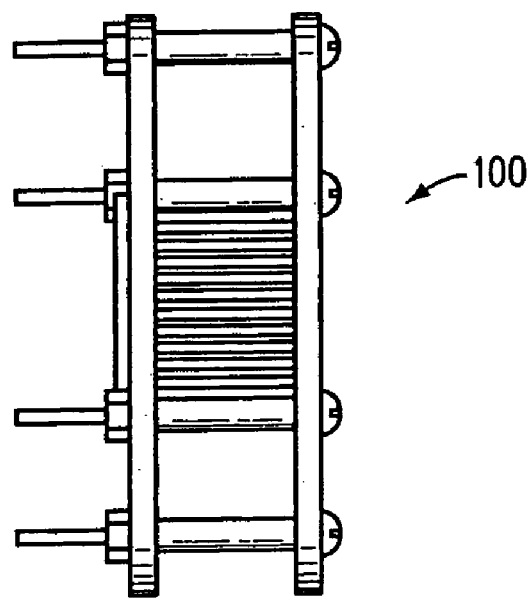
FIGS. 2A and 2B are drawings showing an embodiment of a 140 GHz PBG cavity having a periodic triangular lattice, in perspective and side views, respectively.
Figure 2A:
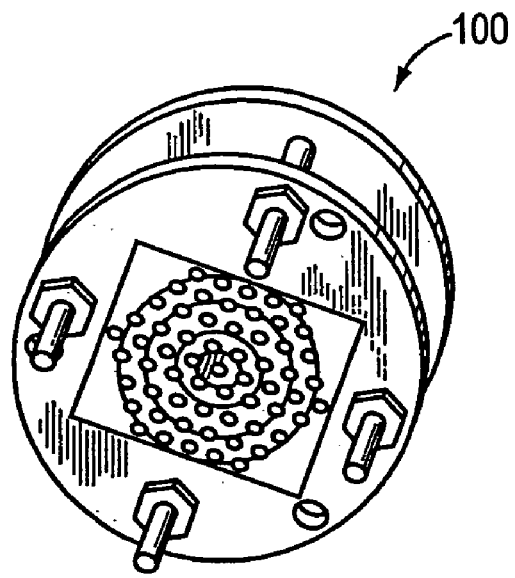

FIGS. 2A and 2B are drawings of a 140 GHz PBG cavity 100 constructed of two oxygen free high conductivity (OFHC) copper endplates perforated with 121 holes in a periodic triangular lattice. The spacing between the adjacent rows of rods in the horizontal direction is 1.76 mm and in the vertical direction is 1.02 mm. One hundred and two (102) OFHC copper rods of 1/16 inch diameter are placed in the outer holes. A small hole in the center of the first (entrance) endplate formed the cut-off section of the cavity 100 while a larger hole in the second (exit) endplate was used to extract the electromagnetic radiation from the cavity 100 through diffraction. The entire structure is held together with mechanical fasteners such as bolts and nuts. If the fasteners are far enough away from the active portion of the PBG structure, the fasteners can be made of metal. If the fasteners are likely to be close enough to the PBG structure to affect the fields therein, the fasteners can be made of an insulator such as Nylon, Teflon or ceramic materials. Ceramic screws and nuts are known, and can be purchased from Ceramco, Inc. of Center Conway, N.H.

The cavity 100 need not necessarily comprise an array of metal rods. In an alternative embodiment, it can be an array comprising either natural or synthetic dielectric material or a combination of dielectrics and metals.

Figure 3:
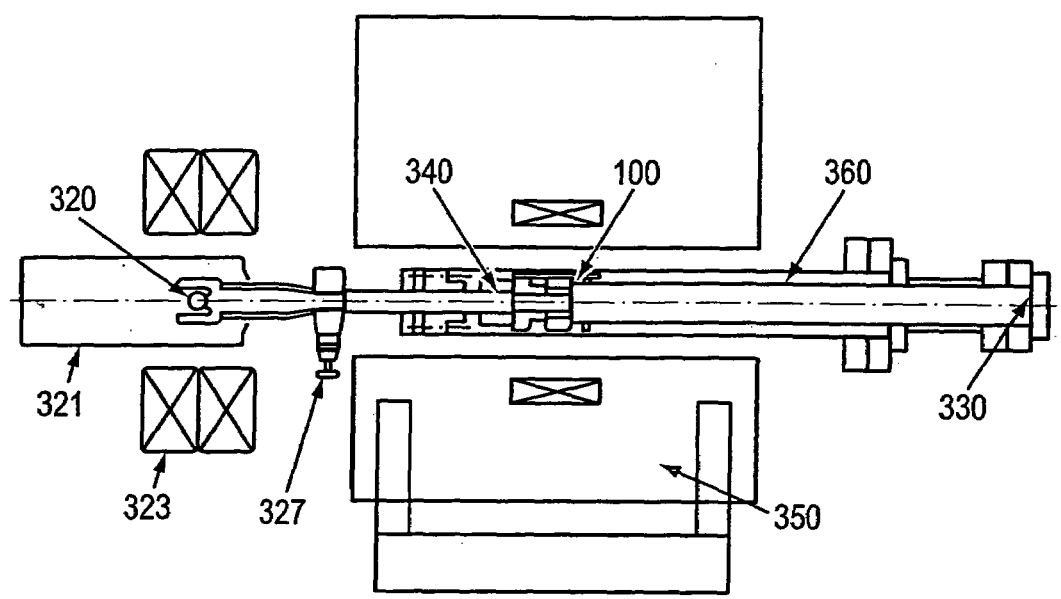
FIG. 3 is a diagram that shows the arrangement of an embodiment of a gyrotron oscillator device with the photonic bandgap structure ("PBG gyrotron oscillator") in a 140 GHz operating environment.

The 140 GHz cavity described above was tested in actual operation in an electron beam system shown in FIG. 3. FIG. 3 is a diagram that shows the arrangement of the gyrotron oscillator device with the PBG structure ("PBG gyrotron oscillator") 100 in an operating environment, and omits pumping ports and various diagnostic features. A hollow annular electron beam is produced at an emitter 320 of a magnetron injection gun (MIG) 321, which is separated from the remainder of the apparatus by a gate valve 327. The electron beam is controlled and focussed within the MIG 321 by gun magnets 323. The electron beam was guided through the PBG cavity 100 immersed in a 5.4 Tesla (T) magnetic field provided by a superconducting magnet 350. The electron beam traverses the PBG cavity 100 passing through the holes in the endplates. The spent electron beam emerging from the cavity 100 after interaction was collected by a steel pipe which also served as a waveguide to transport the electromagnetic radiation from the cavity 100 to the window 330 of the gyrotron. The electron beam propagates in a beam tunnel 340. Stray electrons are collected by a collector 360 situated at the downstream end of the beam tunnel 340.

In order to test the PBG gyrotron oscillator for mode selectivity, the device has been operated at 68 kV, 5 A over the magnetic field range of 4 to 6 T. The mode with an operating frequency of 140.05 GHz ($TE_{041}$) is the only strong mode emanating from the cavity. Angular scans of the output radiation were used to verify that the 140 GHz mode is a $TE_{04}$-like mode. This result is direct confirmation of the mode selectivity of the PBG cavity.

The description of the Photonic Band Gap Structure Simulator (PBGSS) code is now presented. This code allows one to calculate the Brillouin diagrams in both, metal square and metal triangular lattices. The code represents an extension of global band gap calculations to triangular as well as square lattices and to a very wide range of frequencies.

Figure 4A:
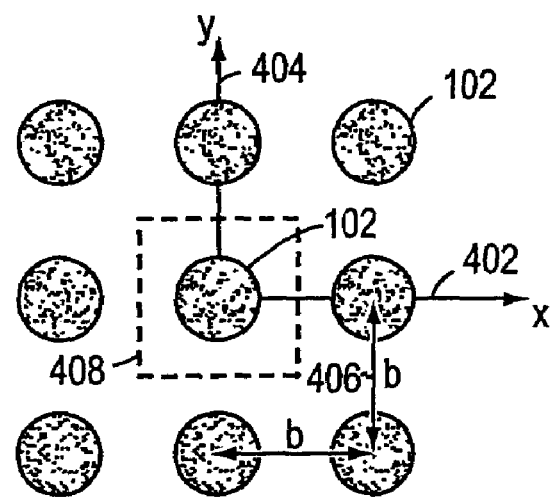
FIG. 4A is an illustrative diagram that shows the geometry of an embodiment of a square two-dimensional (2D) photonic bandgap lattice having members with radius a and lattice spacing b, that is suitable for use as a photonic band gap structure, according to principles of the invention.
Figure 4B:
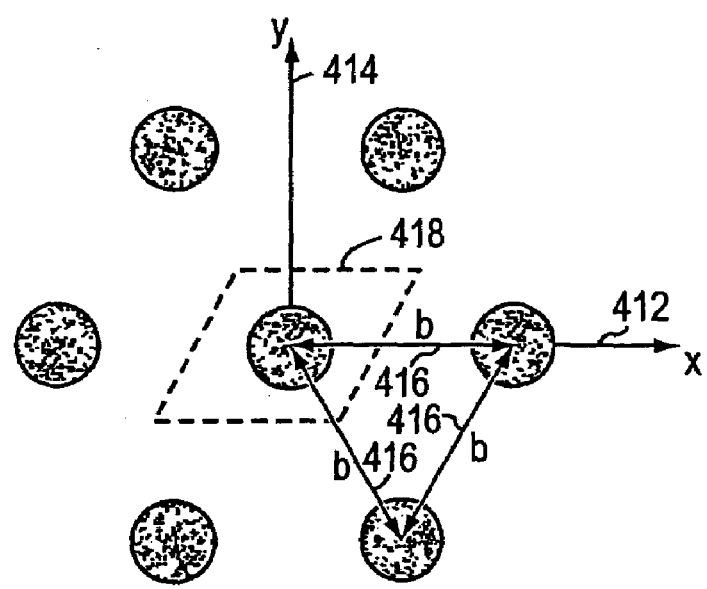
FIG. 4B is a diagram that shows a triangular or hexagonal two-dimensional lattice having members with radius a and lattice spacing b, that is suitable for use as a photonic band gap structure, according to principles of the invention.

The code calculates the dispersion curves for two types of metal lattices, namely, the square lattice shown in FIG. 4A and the triangular lattice shown in FIG. 4B, in which radio-frequency (RF) waves propagate. In one embodiment, the lattice is modeled as comprising a 2D periodic array of perfect conductors. FIG. 4A is an illustrative diagram that shows the geometry of a square two-dimensional (2D) photonic bandgap lattice. In FIG. 4A, the directions of the x 402 and y 404 vectors defining the basis vectors of the two dimensional array are shown. Since the lattice or array of FIG. 4A is a square lattice, the distance between centers of adjacent rods 102 or fingers is the distance b 406 in both the x and y directions. The dotted square 408 located with its center at the origin (x=0, y=0) that encloses the central member 102 of the array indicates the "unit cell" of the lattice. FIG. 4B is an illustrative diagram that shows the geometry of a triangular (or hexagonal) two-dimensional (2D) photonic bandgap lattice. In FIG. 4B, the directions of the x 412 and y 414 vectors defining the basis vectors of the two dimensional array are shown. Since the lattice or array of FIG. 4B is a triangular (or hexagonal) lattice, the distance between centers of adjacent rods 102 or fingers is the distance b 416. The dotted parallelepiped 418 located with its center at the origin (x=0, y=0) that encloses the central member 102 of the array indicates a "unit cell" of the hexagonal lattice, while the triangle of solid lines 416 indicates a "unit cell" of the triangular lattice.

The system of 2D periodic array of perfectly conducting metal cylinders is fully described by the periodic conductivity profile, which for the case of square lattice is:

$$\sigma(x) = \sigma(x_\perp) = \begin{cases} \infty, & (x-mb)^2 + (y-nb)^2 < a^2, \\ 0, & \text{otherwise,} \end{cases} \quad (1)$$

and for the triangular lattice is given by:

$$\sigma(x) = \sigma(x_\perp) = \begin{cases} \infty, & \left[x-\left(m+\frac{n}{2}\right)b\right]^2 + \left[y-\frac{\sqrt{3}}{2}nb\right]^2 < a^2, \\ 0, & \text{otherwise,} \end{cases} \quad (2)$$

In (1) and (2), (x, y) are the transverse coordinates, $x_\perp = x\hat{e}_x + y\hat{e}_y$ is the transverse displacement, a is the radius of the conducting cylinder, b is the lattice spacing, and m and n are integers. In other embodiments, the metal cylinders can be conductive elements having less than perfect conductivity, that is, elements that represent materials having a finite resistance R. The resistance R can be a function of temperature, frequency, composition and other factors known to affect the conductivity of real conductors.

The conductivity profile satisfies the periodic condition:

$$\sigma(x_\perp + T_{mn}) = \sigma(x_\perp), \quad (3)$$

with the set of periodicity vectors $T_{mn}$ defined as:

$$T_{mn} = \begin{cases} mb\hat{e}_x + nb\hat{e}_y & \text{(square lattice),} \\ \left(m + \dfrac{n}{2}\right)b\hat{e}_x + \dfrac{\sqrt{3}}{2}nb\hat{e}_y & \text{(triangular lattice).} \end{cases} \quad (4)$$

The wave field in the two-dimensional PBG structures can be decomposed into two independent classes of modes: the transverse electric (TE) mode and the transverse magnetic (TM) mode. In TE mode the electric field vector is perpendicular to the pole axis and in TM mode the magnetic field vector is perpendicular to the pole axis. All the field components in the TM (TE) modes can be expressed through the axial component of the electric (magnetic) field, which we will further denote by $\Psi$. Since the system is homogeneous along the z-axis, one can take the Fourier transform of $\Psi$ in axial coordinate z and time t and consider:

$$\psi(x_\perp, k_z, \omega) = \int\int \psi(x_\perp, z, t) e^{i(k_z z - \omega t)} dz dt, \quad (5)$$

which will be denoted hereafter by $\psi(x_\perp)$ assuming that the frequency $\omega$ and the longitudinal wave number $k_z$ are fixed. The Helmholtz equation for $\psi(x_\perp)$ follows from the Maxwell equations:

$$\nabla_\perp^2 \psi(x_\perp) = \left(k_z^2 - \dfrac{\omega^2}{c^2}\right)\psi(x_\perp). \quad (6)$$

The boundary conditions on the surfaces S of the conducting poles are:

$$\psi|_S = 0 \text{ (TM mode),} \quad (7)$$

$$\left(\dfrac{\partial \psi}{\partial n}\right)\bigg|_S = 0 \text{ (TE mode),} \quad (8)$$

where n is the normal vector to the pole surface.

The discrete translational symmetry of the conductivity profile allows one to write the fundamental solution of the Helmholtz equation in Bloch form so that:

$$\psi(x_\perp + T) = \psi(x_\perp) e^{ik_\perp \cdot T}, \quad (9)$$

where T is any vector of $T_{mn}$, $k_\perp = k_x \hat{e}_x + k_y \hat{e}_y$ is an arbitrary transverse wave number. Thus one need only solve (6) inside the fundamental unit cell defined by:

$$|x| \leq b/2, |y| \leq b/2 \text{ (square lattice),} \quad (10)$$

$$\left|x - \dfrac{y}{\sqrt{3}}\right| \leq \dfrac{b}{2}, |y| \leq \dfrac{\sqrt{3}}{4}b \text{ (triangular lattice).} \quad (11)$$

The following periodic boundary conditions are deduced from (9):

$$\begin{cases} \psi\left(-\dfrac{b}{2}, y\right) = e^{ik_x b}\psi\left(\dfrac{b}{2}, y\right) \\ \psi\left(x, -\dfrac{b}{2}\right) = e^{ik_y b}\psi\left(x, \dfrac{b}{2}\right) \end{cases} \text{(square lattice),} \quad (12)$$

$$\begin{cases} \psi\left(-\dfrac{b}{2}, y\right) = e^{ik_x b}\psi\left(\dfrac{b}{2}, y\right) \\ \psi\left(x, \dfrac{\sqrt{3}}{4}b\right) = e^{ik_x \frac{b}{2} + ik_y \sqrt{3}\frac{b}{2}}\psi\left(x - \dfrac{b}{2}, -\dfrac{\sqrt{3}}{4}b\right) \end{cases} \text{(triangular lattice),} \quad (13)$$

Equations (6) together with boundary conditions (7) and (12) or (8) and (13) define the eigenvalue problem of finding $\lambda^2 = \omega^2/c^2 - k_z^2$ as a function of $k_\perp$.

Figure 5A:
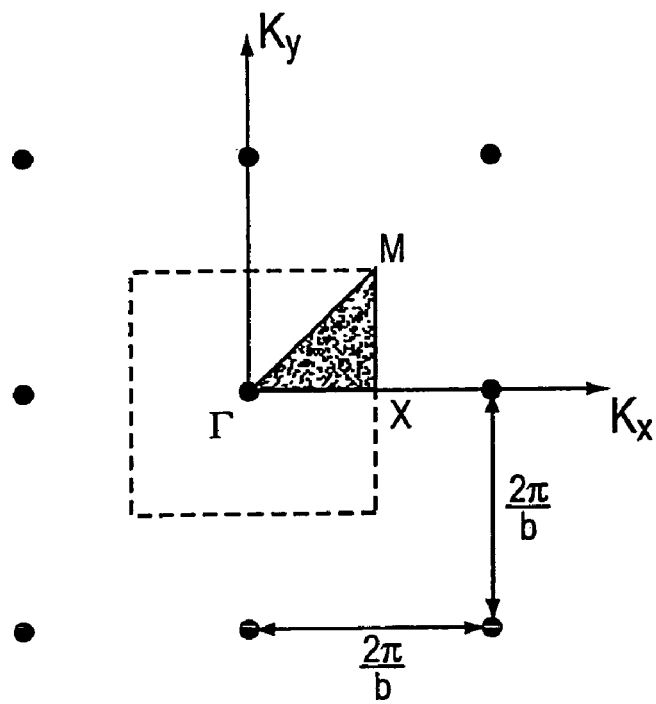
FIGS. 5A and 5B are diagrams that illustrate, respectively, the irreducible Brillouin zones of the corresponding reciprocal lattices for a square lattice such as that of FIG. 4A and a triangular lattice such as that of FIG. 4B.
Figure 5B:
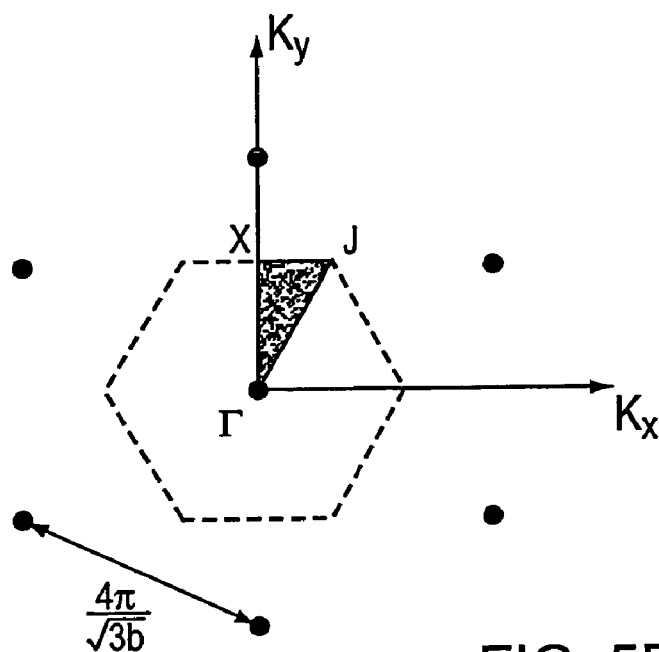

The periodicity of the exponent in (9) means that the possible values $k_\perp$ can be restricted to the irreducible Brillouin zones of the corresponding reciprocal lattices, which for the cases of square and triangular lattices are illustrated in FIGS. 5A and 5B, respectively. The three special points in FIG. 5A, $\Gamma$, X and M correspond respectively to $$k_\perp = 0, k_\perp = \dfrac{\pi}{b}\hat{e}_x$$

and $$k_\perp = \dfrac{\pi}{b}(\hat{e}_x + \hat{e}_y).$$

The three special points in FIG. 5B, $\Gamma$, X and J correspond to $$k_\perp = 0, k_\perp = \dfrac{2\pi}{\sqrt{3}b}\hat{e}_y \text{ and } k_\perp = \dfrac{2\pi}{3b}(\hat{e}_x + \sqrt{3}\hat{e}_y).$$

The PBGSS code is based on a real-space finite difference method. One covers the fundamental unit cell of the square (triangular) lattice by a square (triangular) mesh with (2N+1)×(2N+1) mesh points. Outside the conducting poles, the Helmholtz equation (6) is approximated by the set of linear relations between the values $\psi_{i,j}$ of the function $\psi(x_\perp)$ at the point (i, j) of the mesh (the mesh point i=j=0 corresponds to the origin of the fundamental cell). One can refer to the equation:

$$\psi_{i+1,j} + \psi_{i-1,j} + \psi_{i,j+1} + \psi_{i,j-1} - 4\psi_{i,j} = -\lambda^2 h^2 \psi_{i,j} \quad (14)$$

for the square lattice, and:

$$4(\psi_{i+1,j} + \psi_{i-1,j} + \psi_{i,j+1} + \psi_{i,j-1}) - \quad (15)$$
$$(\psi_{i+1,j+1} - \psi_{i+1,j-1} - \psi_{i-1,j+1} + \psi_{i-1,j-1}) - 16\psi_{i,j} = -3\lambda^2 h^2 \psi_{i,j}$$

for the triangular lattice, as "equation (i, j)". The quantity h=b/(2N+1) is the mesh step. The periodic boundary condition (12) and (13) are expressed explicitly as:

$$\psi_{N+1,j} = \psi_{-N,j} e^{ik_x b}, \psi_{i,N+1} = \psi_{i,-N} e^{ik_y b} \text{ (square lattice)}, \tag{16}$$

$$\psi_{N+1,j} = \psi_{-N,j} e^{ik_x b}, \psi_{i,N+1} = \psi_{i,-N} e^{ib/2(k_x + \sqrt{3}k_y)} \text{ (triangular lattice)}. \tag{17}$$

The mesh points, which fall inside the conducting poles, are excluded from the system of linear equations (14) or (15) using boundary conditions (7) or (8). The boundary condition in (7) is implemented by setting the value of $\psi_{ij}=0$ for the grid point (i, j) inside of the conducting cylinder. The boundary condition (8) is implemented as follows. If some point entering the linear equation (i, j) falls inside the pole, one puts the value of $\psi$ in this point equal to $\psi_{i,j}$. This approximation seems to be crude, but the simplest implementation of the boundary conditions is chosen in order to preserve the Hermitian nature of the matrix of linear equations (14) or (15). Since losses in electrodynamic system are neglected, the initial eigenvalue problem is Hermitian. It has been found empirically that the preservation of the Hermitian nature improves the convergence of the algorithm. Thus one obtains a closed set of $(2N+1)^2-M$ linear equations, where M is the number of the mesh points that fall inside the conducting cylinder. The matrix of this system is Hermitian and one computes the eigenvalues $\lambda$ from a standard Fortran subroutine.

Figure 6A:
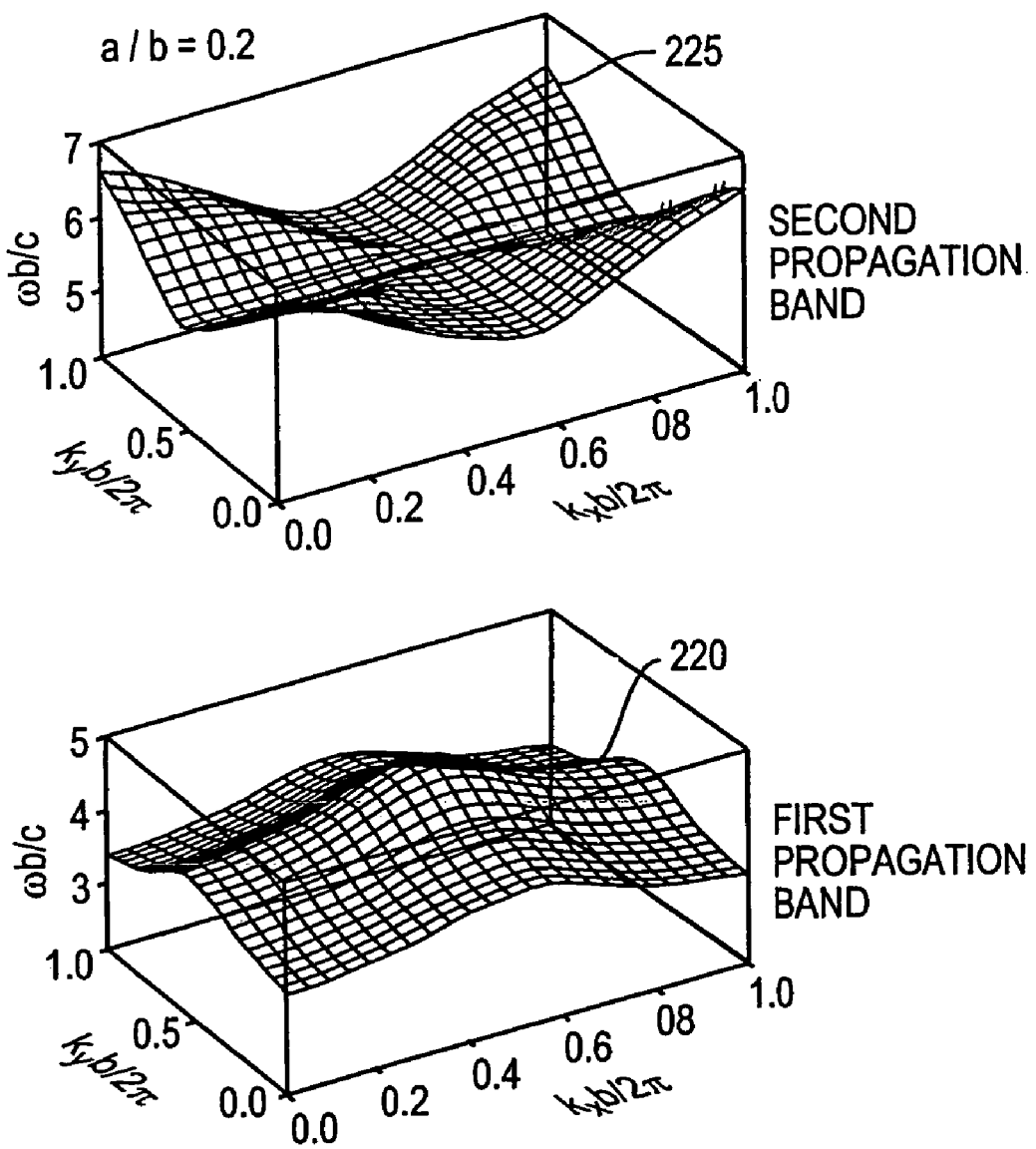
FIG. 6A is a diagram showing two-dimensional plots of the normalized frequency $\omega b/c$ versus normalized wave vector $(k_x b/2\pi, k_y b/2\pi)$ for the first- and second-propagation bands of a square 2D lattice calculated using a/b=0.2, which plots indicate the presence of a photonic bandgap.

FIG. 6A is a diagram showing two-dimensional plots of the normalized frequency $\omega b/c$ versus normalized wave vector ($k_x b/2\pi$, $k_y b/2\pi$) for the first propagation band 220 and second-propagation band 225 of a square 2D photonic bandgap lattice calculated using a/b=0.2. The plots indicate the presence of a photonic bandgap which is seen more clearly in FIG. 6B.

Figure 6B:
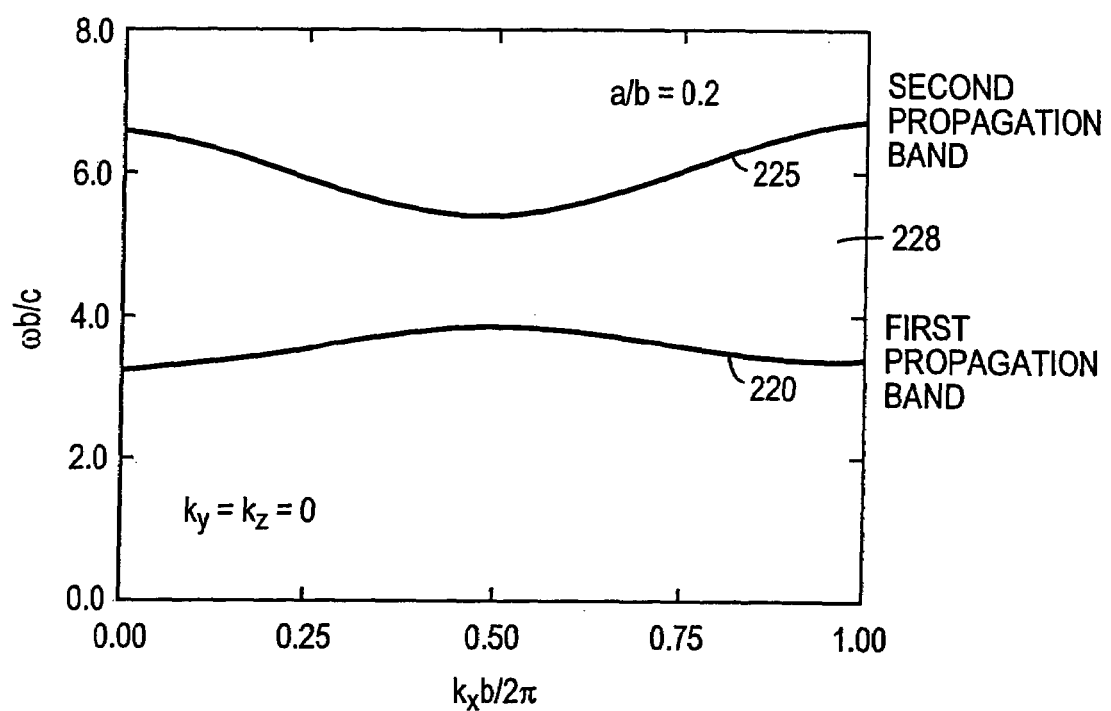
FIG. 6B is a diagram that shows an illustrative Brillouin diagram calculated for a TM mode of an exemplary square array 2-D PBG cavity.

FIG. 6B is a diagram that shows an illustrative Brillouin diagram calculated for a TM mode of an exemplary square array PBG cavity. A Brillouin diagram is a graphical representation of the dispersion relation for the PBG structure, as is understood by those skilled in the theoretical aspects of the PBG arts. The calculation represented by FIG. 6B was performed using the parameters $k_y=k_x=0$ and a/b=0.1 The Brillouin diagram of FIG. 6B shows the presence of a photonic bandgap 228 everywhere in the unit cell as viewed along the x direction between the first propagation band 220 and the second propagation band 225.

Figure 6C:
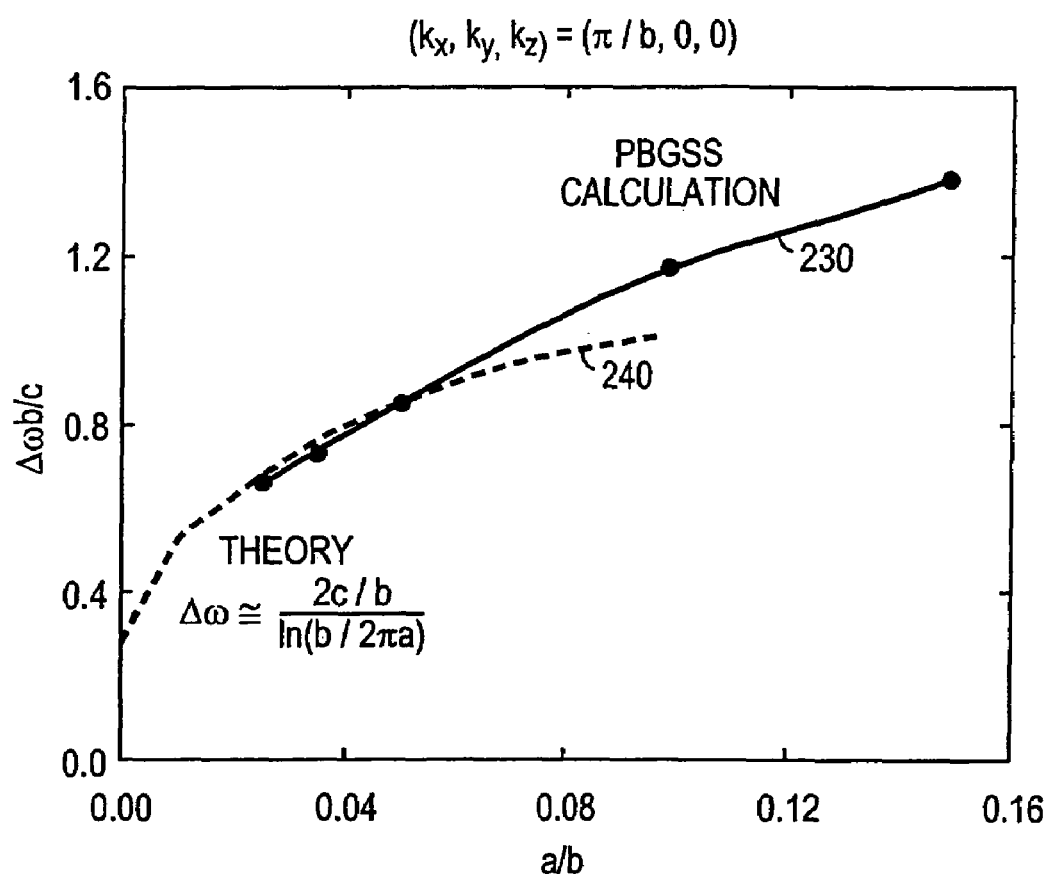
FIG. 6C is a diagram that shows the normalized bandgap width $\Delta \omega b/c$ vs. a/b calculated for a TM mode of an illustrative square array PBG cavity using the PBGSS calculation of the invention and the same curve derived theoretically.
Figure 7A:
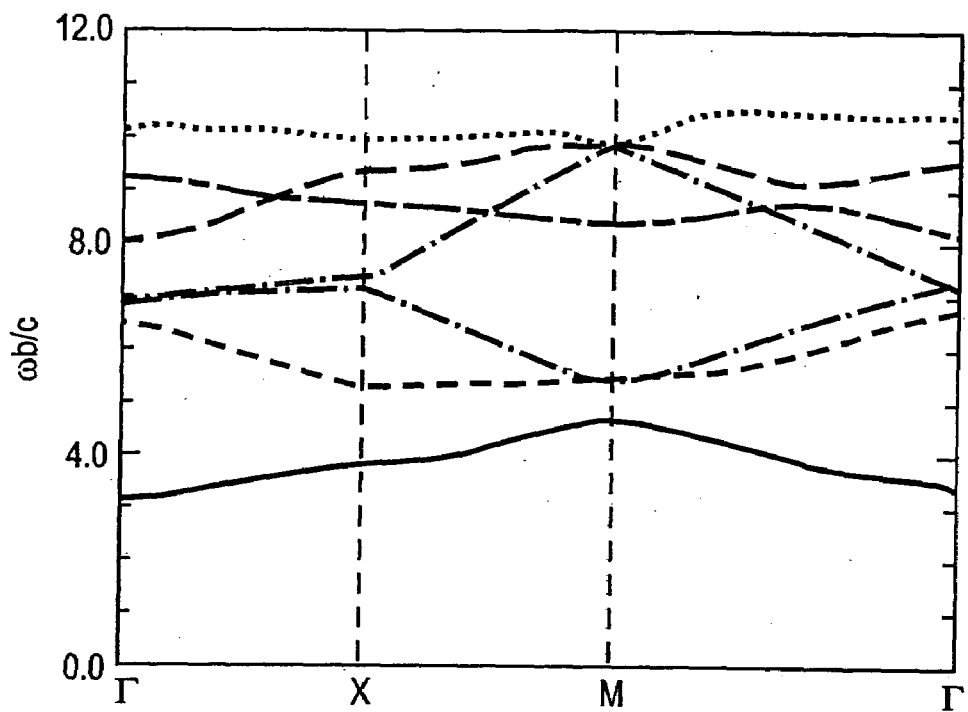
FIGS. 7A–7D are diagrams showing further examples of the dispersion curves obtained using the PBGSS code, according to principles of the invention.
Figure 7B:
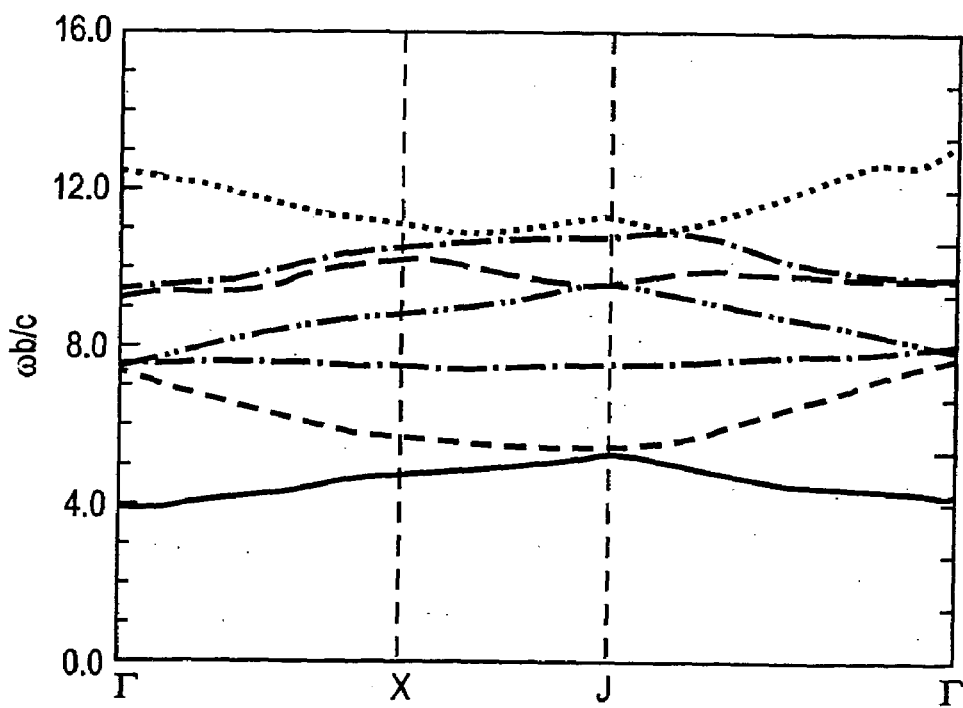
Figure 7C:
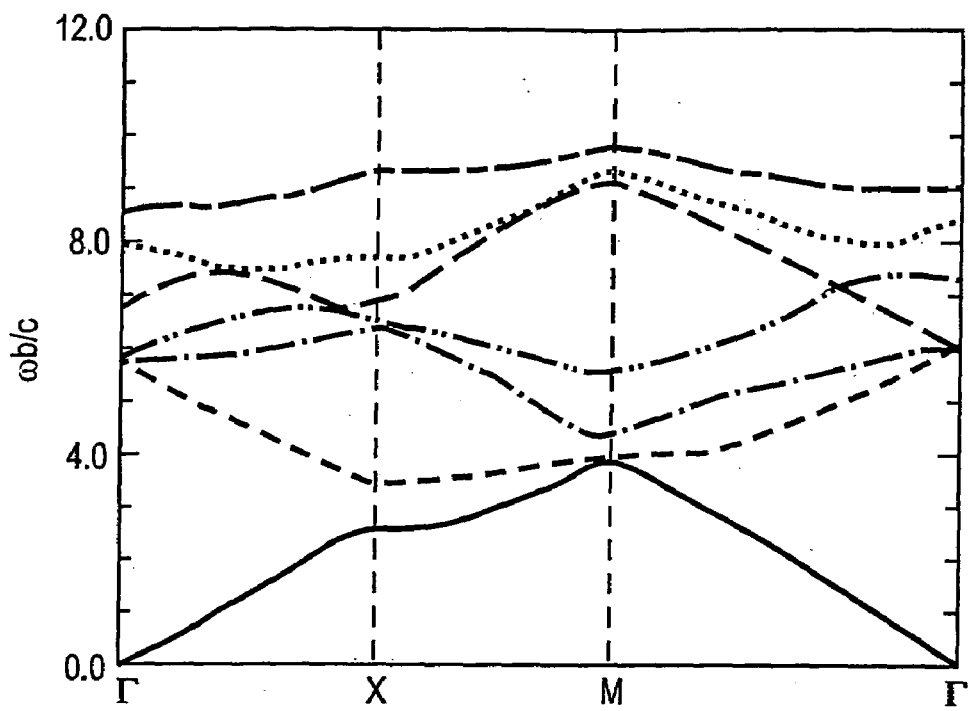
Figure 7D:
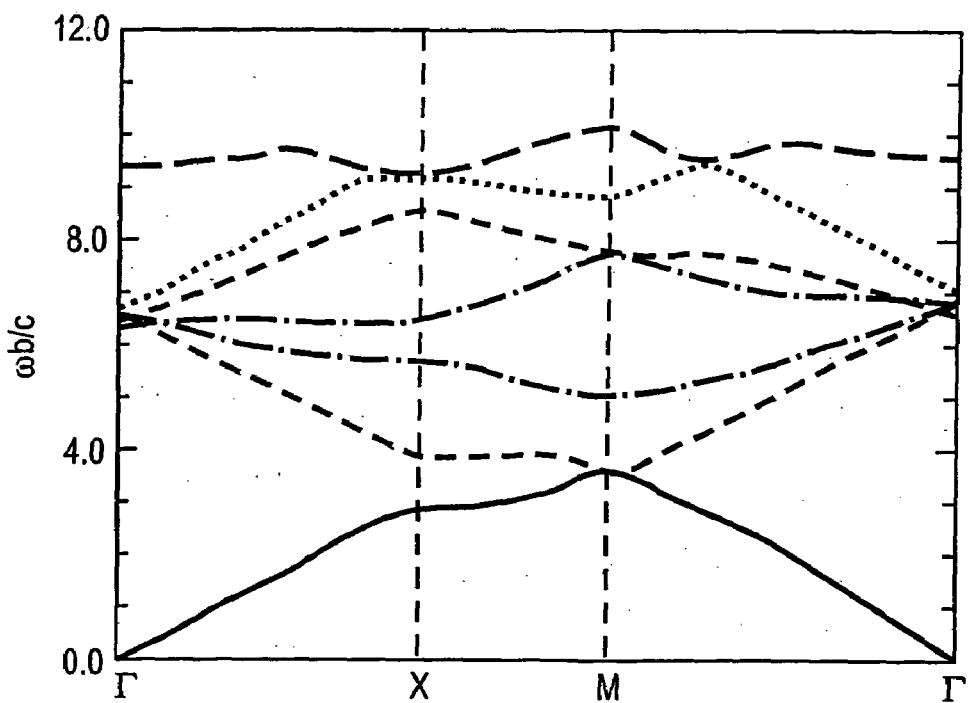

FIG. 6C is a diagram that shows the normalized bandgap width $\Delta\omega b/c$ vs. a/b calculated for a TM mode of an illustrative square array PBG cavity using the PBGSS calculation (curve 230) and the curve 240 derived using quasi-static theory. A wave vector with ($k_x$, $k_y$, $k_z$)=$(\pi/b,0,0)$ and small values of a/b are represented. The PBGSS calculations are in good agreement with the quasi-static theory, which is valid for a/b<0.05.

In one embodiment, the PBGSS code of the invention is written in modular form, for example in an object oriented programming (OOP) language commonly used in the software arts, such as C++. Any suitable programming language can be used to write the PBGSS code. Other embodiments, which do not involve modular code, are also possible. Those of ordinary skill in the programming arts will recognize, however, that any of the modules (or any convenient portion of the code) can also be created as hardware or as firmware. In the description that follows, any module described as a software module can also be prepared in the form of hard-wired circuitry, programmed logic (such as programmable gate arrays (PGAs), read-only memory (ROM), programmable read-only memory (PROM), and the like), or some combination of circuitry and logic. The PBGSS code includes a modeling module, a boundary condition module, an approximation module, a computation module, an optional graphical user interface module, and an optional display module. The code runs on conventional commercially available computers, as described further below.

The modeling module represents components of a photonic bandgap structure as a linear equation corresponding to a unit cell. The modeling module constructs, or defines, the model of the PBG structure to be solved. The boundary condition module represents a boundary condition for the unit cell. The boundary condition module provides information about the periodicity and symmetry of the modeled PBG structure in mathematical form suitable for use in the computation. The approximation module approximates the linear equation using a Hermitian matrix. The approximation module creates a simplification of the modeled PBG structure that retains the salient features of the structure while making the mathematical problem more tractable. The computation module calculates an eigenvalue of the Helmholtz equation in a Hermitian matrix form for the unit cell. The computation module calculates a characteristic solution of the modeled PBG structure using the simplifications introduced into the model. The boundary condition is applied to a solution of a Helmholtz equation defined for the unit cell. The boundary condition is used to generate a specific solution of the equation of the model that corresponds to the particular PBG structure that is modeled. Those of ordinary skill will recognize that a plurality of equations, a plurality of boundary conditions, a plurality of eigenvalues, and matrices of plural dimensionality can be employed in the systems and methods of the invention.

The optional graphical user interface module provides a graphic user interface for user interaction with the modeling module. The graphical user interface is a tool that makes operation of the computational system and method easier for the non-expert user. The user can interact with the system, and can control the method of operation, by invoking commands through the graphical user interface. The optional display module displays a calculated eigenvalue result to a user. The result displayed corresponds to a photonic energy level in a Brillouin zone of the unit cell. The display module provides a convenient and readily comprehensible form of output, such as graphical output or auditory output, in addition to textual or tabular output that a user can review and retain in any convenient form, such as hard copy delivered by a printer, plotter or the like, or recorded on a machine-readable medium for display at a later time.

In one embodiment, the user needs one of the Windows™ 95/98/NT/2000 operating systems, available from Microsoft Corporation, Richmond, Wash., to run the PBGSS code on a conventional commercially available desktop or laptop computer. Also, in one embodiment, a datasheet program such as Excel™ 9, which is part of the Microsoft™ Office™ 2000 available from Microsoft Corporation, Richmond, Wash., is used to display the Brillouin diagrams using the code. The user, who does not have Microsoft™ Office™ 2000, can write the data to file and use separate programs for plotting the dispersion curves.

The PBGSS code works with square and triangular metal lattices. The code calculates the dispersion diagrams for both types of lattices. Most importantly, the code calculates the global band gaps for TE and TM modes in square and triangular lattices. In addition, the code calculates the width of a local band gap at symmetry points of the reciprocal lattice.

Illustrative examples of the dispersion curves obtained using the PBGSS code are given in FIGS. 7A–7D. In FIGS. 7A–7D, there are illustrative plots of the several lowest normalized eigenmodes versus the wave vector $k_\perp$ as $k_\perp$ varies from the center of the Brillouin zone (Γ point in FIGS. 5A–5B), to the nearest edge of the Brillouin zone (X point in FIGS. 5A–5B), and to the far edge of the Brillouin zone (M or J point). In FIGS. 7A–7D, a/b=0.2, and the four cases correspond to (FIG. 7A) TM mode for a square lattice, (FIG. 7B) TM mode for a triangular lattice, (FIG. 7C) TE mode for a square lattice, and (FIG. 7D) TE mode for a triangular lattice.

Figure 8A:
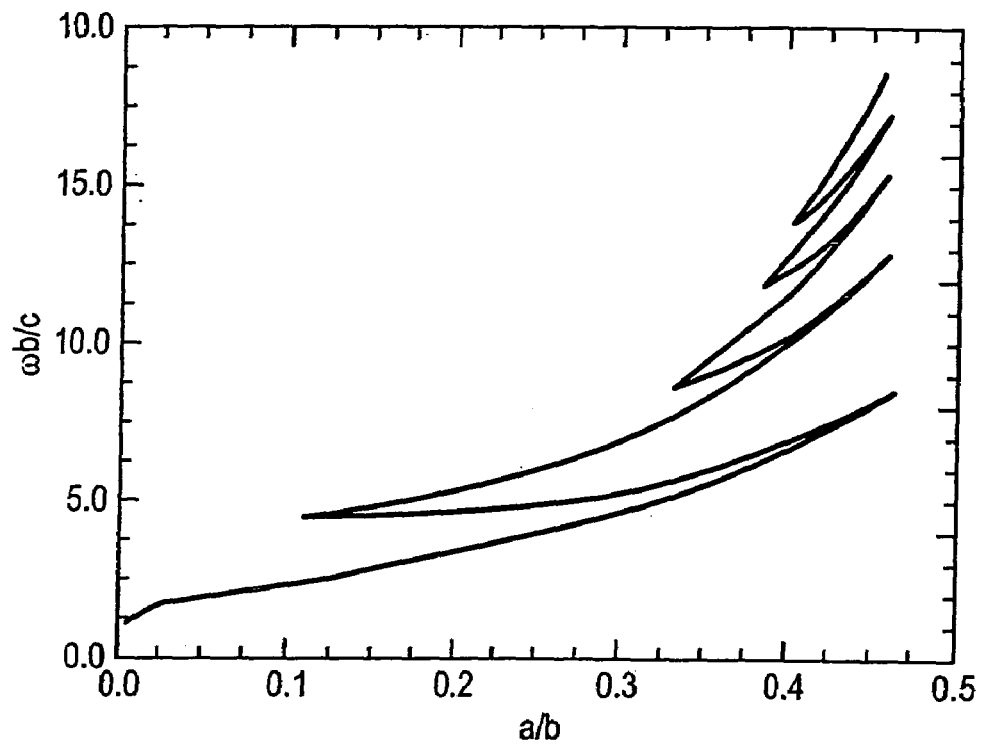
FIGS. 8A–8D are diagrams showing the results of the global band gap calculations for both square and triangular lattices, according to principles of the invention.
Figure 8B:
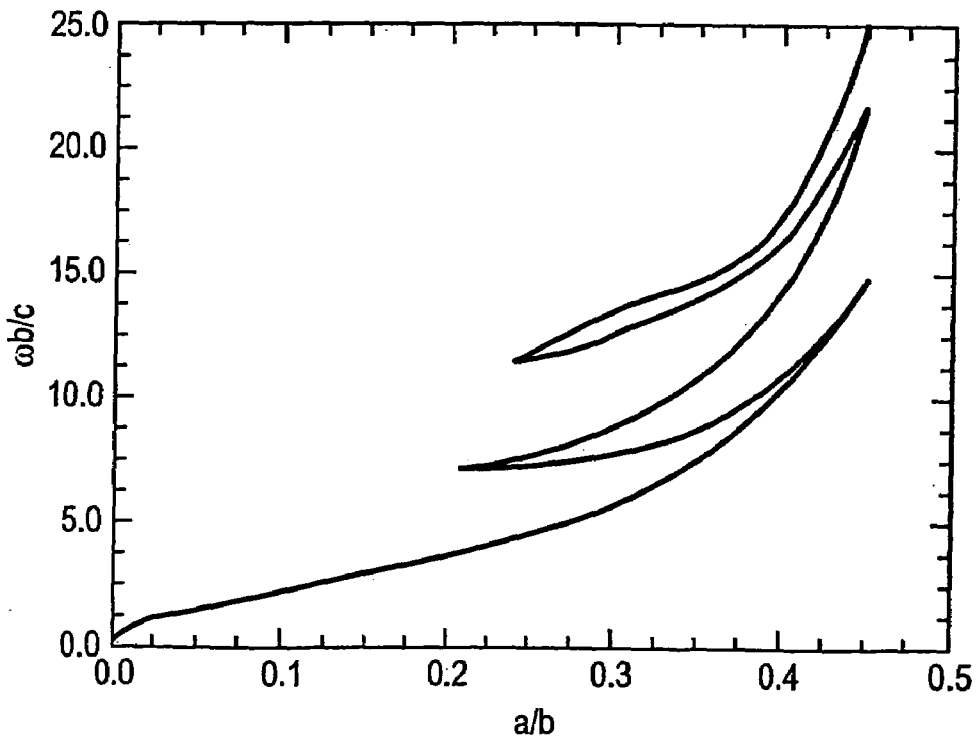
Figure 8C:
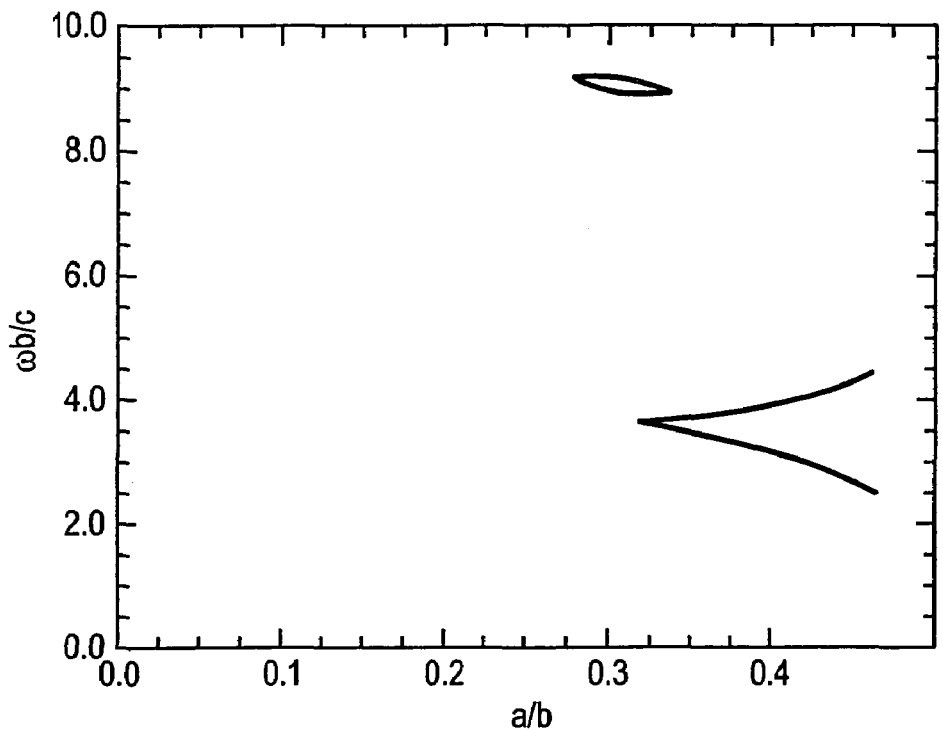
Figure 8D:
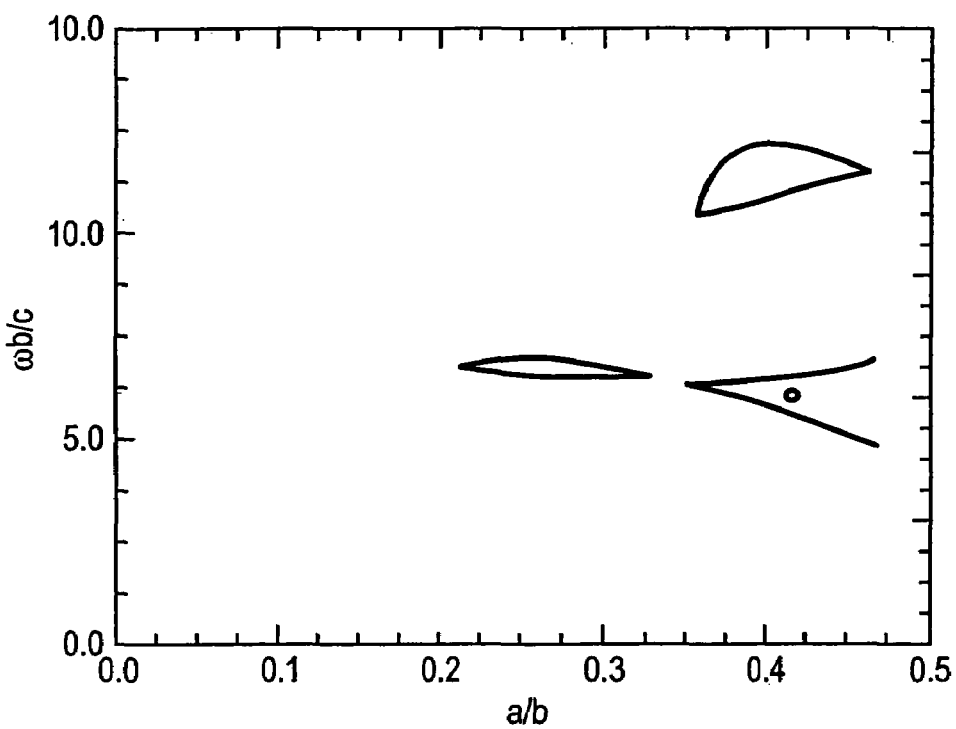

The results of the global band gaps calculation for both square and triangular lattices, are given in FIGS. 8A–8D. FIGS. 8A–8D are plots of global frequency band gaps as functions of a/b as obtained from PBG calculations for (FIG. 8A) TM mode for a square lattice, (FIG. 8B) TM mode for a triangular lattice, (FIG. 8C) TE mode for a square lattice, and (FIG. 8D) TE mode for a triangular lattice. FIG. 8A is a diagram of calculated global band gaps for the TM polarization in a series of illustrative 2D square lattices of metal members, in which the range of normalized frequencies ($\Omega=\omega b/c$) is plotted as a function of the ratio of rod radius to lattice spacing ($\alpha=a/b$). The solid dot in FIG. 8B represents the operating point of the 17 GHz MIT accelerator cavity. The solid dot in FIG. 8D represents the operating point of the 140 GHz MIT gyrotron cavity.

While the global TE band gaps in the metallic lattice resemble qualitatively the previously reported global TE and TM band gaps in dielectric lattices, which typically close with increasing a/b, there are two striking differences between metallic global TM band gaps and dielectric global band gaps, which have been calculated previously. First, there is a zeroth-order global TM band gap in metallic lattices, which is a cutoff analogous to that in a conventional waveguide and exists for all values of a/b, whereas there is no such cutoff in dielectric lattices for either TE or TM mode. Second, the width of the global TM band gap in the metallic lattice increases with increasing a/b, whereas the global TE and TM band gaps in dielectric lattices typically close as the ratio a/b increases.

The PBG code was originally created to verify the single mode excitation in two PBG experiments conducted recently at MIT. The first one was the accelerator cavity experiment with TM mode, and the second one was the gyrotron cavity experiment with TE mode. The cavities were designed to eliminate the competing modes, which appear in conventional accelerator or gyrotron resonators and reduce the efficiency of the bunch acceleration or mode excitation. The SUPERFISH and HFSS codes were used for those PBG cavity designs. However, neither SUPERFISH nor HFSS codes can be used to calculate global band gaps in PBG cavities and thus cannot serve as a proof of the single mode excitation. The MIT accelerator cavity and the MIT gyrotron cavity are briefly described below.

The MIT PBG accelerator cavity is made up of a triangular lattice of metal rods and operates in the TM mode at 17 GHz. The PBG accelerator cavity was first proposed with the accelerating TM mode formed by a defect in a 2D metal lattice. A defect in the 17 GHz MIT accelerator cavity is created by one missing rod. The lattice has the pole radius a=0.079 cm and the distance between the nearest poles b=0.64 cm, which corresponds to a/b=1.23 and $\omega b/c$=2.28. The operational point of the cavity is shown by the solid dot in FIG. 8B. It can be seen from the picture that the cavity operates in the zero-order band gap (below the cutoff) and there are no other bandgaps above. This proves that there is only one mode, which can be confined in the cavity. The higher frequency modes excited by the electron bunch in conventional accelerator (wakefields) are able to leak through the lattice, which provides an effective damping mechanism for the wakefields in the cavity.

The MIT PBG gyrotron resonator cavity is made up of a triangular lattice of 102 copper rods and operates in the TE mode at 140 GHz. Although the triangular array can hold 121 rods, but the 19 innermost rods were omitted to create a defect. The lattice parameters are: pole radius a=0.795 mm and distance between the nearest poles b=2.03 mm, which corresponds to a/b=0.39 and $\omega b/c$=5.95. The operational point of the cavity is shown by the solid dot in FIG. 8D. The diagram shows that the cavity operates in the middle of the first-order global band gap. The HFSS model of the PBG gyrotron cavity is shown in FIG. 9B with magnitude of the electric field in the confined mode shown in color. The mode structure resembles the structure of the $TE_{041}$ mode of conventional gyrotron cavity.

Traditional gyrotron cavities are cylindrical copper cavities with a downtaper to cutoff at the entrance for mode confinement and an uptaper at the exit for output coupling. These cavities need to be overmoded to be sufficiently large to keep the cavity ohmic load to below about 2 $kW/cm^2$, which is a limit imposed by conventional cooling technology. In the present invention the cylindrical outer copper wall is replaced with a PBG structure.

A higher order TE-like waveguide mode can exist in this cavity if its resonant frequency lies in the stopband (bandgap) of the PBG structure. The bandgap can be adjusted such that the resonant frequencies of all other modes lie in the passband of the lattice and hence can leak through the array that acts like a transparent wall at those frequencies. Initial lattice dimensions were chosen using an analytic theory, and simulations in SUPERFISH and simulations using HFSS helped refine these dimensions. In FIG. 9B, a perspective view of the HFSS model of the PBG gyrotron cavity 100 is shown. In FIG. 9B, an empty circle 103 designates the location of each conductive rod or member 102, corresponding to the absence of electric field at that location, since no field exists within the conductor. The array can hold 121 rods but the 19 innermost rods (e.g., in an hexagonal array, the center rod and the next two layers of the hexagonal array surrounding the central rod, comprising 6 and 12 rods, respectively) have been omitted to form the cavity. The illustrative embodiment comprises three full hexagonal layers, and all but the rods at the six (6) vertex positions of the fourth, outermost, hexagonal layer. The frequency of the confined eigenmode shown in the model is 139.97 GHz and the mode structure resembles the $TE_{041}$-like mode of a conventional cylindrical cavity, which is shown in FIG. 9B. The other neighboring eigenmodes, being in the passband of the lattice, suffer significant losses due to the transparent cavity wall. Radiation that passes through the array propagates out and is not reflected back into the lattice. This feature of this novel gyrotron cavity is designed to permit strong single mode operation in the $TE_{041}$-like mode.

The PBGSS code calculations not only help us with understanding of the PBG accelerator and PBG gyrotron experimental results, but also suggest some improvements, which can be made in future cavity designs. For example, as it can be seen from FIG. 8D, the pole radius in the accelerator cavity at 17 GHz can be increased without affecting the selectivity properties. The increase of the pole radius can help to solve the problem of the rods cooling, which becomes critical in high intensity rf accelerators.

Figure 9A:
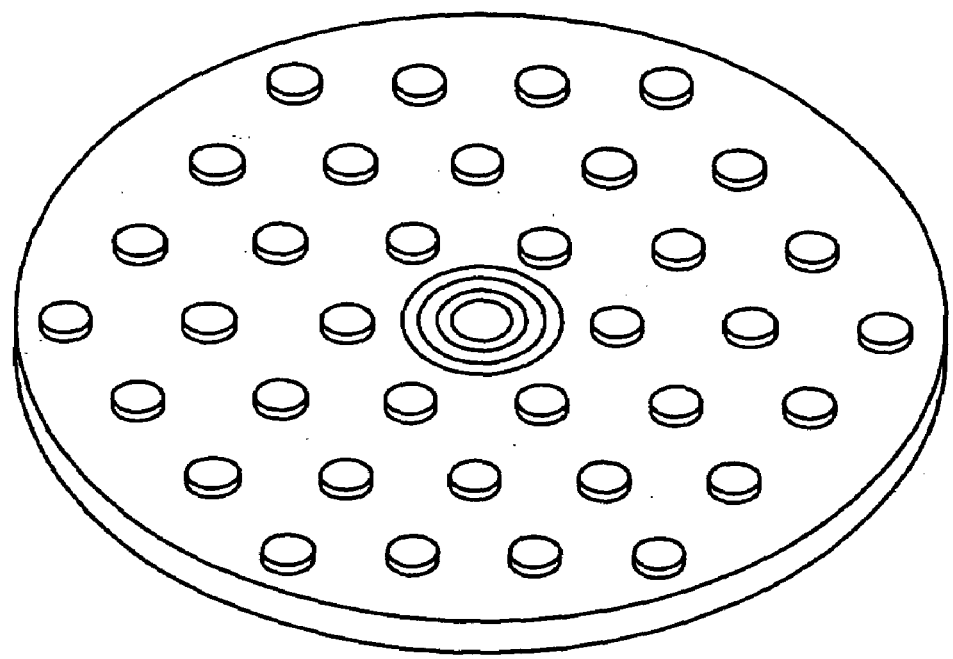
FIGS. 9A–9B are drawings that show the cross-section of the HFSS model of the PBG accelerator cavity in a TM mode and a TE mode respectively.
Figure 9B:
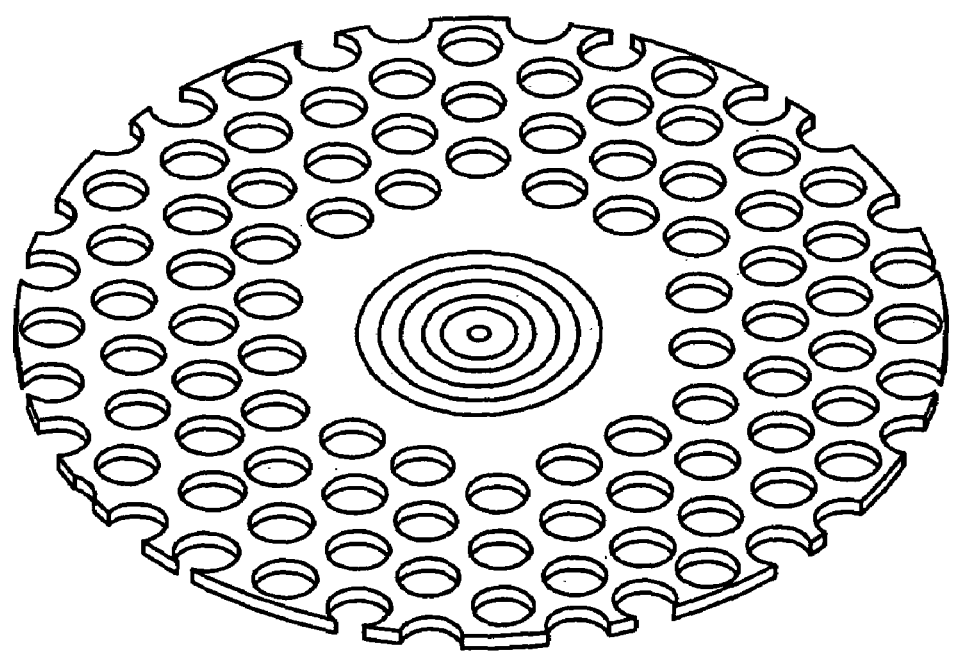

FIGS. 9A and 9B are drawings that show the magnitude of the electric field in a mode confined in a PBG cavity as obtained from the HFSS simulations. FIG. 9A shows the $TM_{010}$-like mode at 17 GHz, and FIG. 9B shows the $TE_{041}$-like mode at 140 GHz. FIG. 9A shows the cross-section of the HFSS model of the PBG accelerator cavity. The magnitude of the electric field of the confined mode is shown in color. The mode structure resembles the structure of the $TM_{010}$ mode of a conventional linac pillbox cavity.

The code is designed with a graphic user interface, so that it is easy to run it. The graphic user interface allows the user to input the parameters of the simulation, to look at the structure parameters which were entered, and to plot the results of the dispersion curves calculation.

Figure 10:
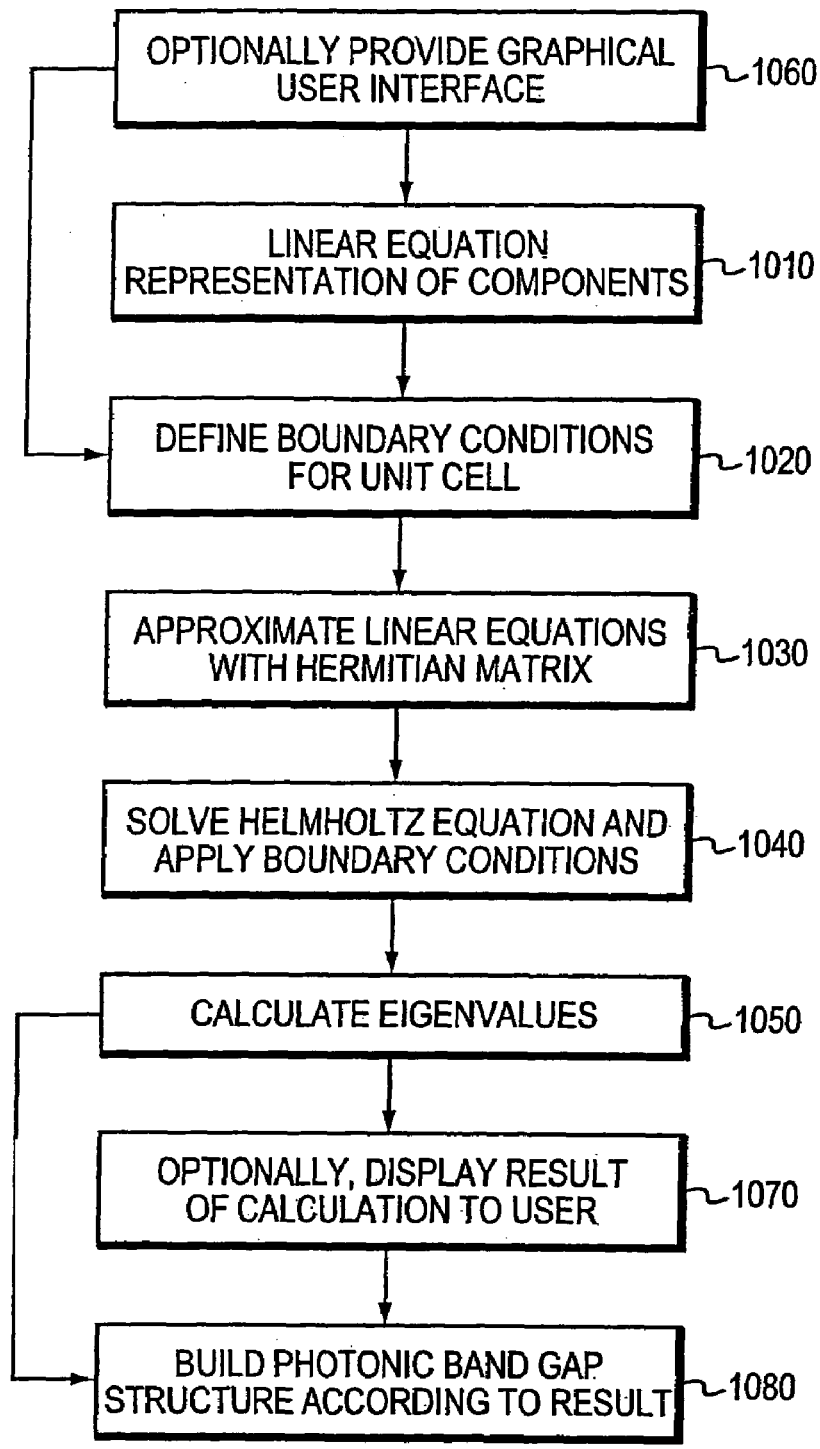
FIG. 10 is a schematic flow diagram that shows the steps performed in an illustrative method according to principles of the invention.

The flow diagram depicted in FIG. 10 illustrates the steps of an embodiment of the method. Alternatively, FIG. 10 can be understood to depict the relation between the modules that are provided in an embodiment of an illustrative system. The flow diagram indicates, at box 1010, that the method begins with the representation of components of a photonic bandgap structure to be modeled as one or more linear equations corresponding to a unit cell structure. One or more boundary conditions that exist at the edges of the unit cell are represented, as indicated by box 1020. As indicated in box 1030, the one or more linear equations are approximated by a Hermitian matrix that corresponds to the unit cell. The boundary condition or conditions are applied to a solution of a Helmholtz equation defined for the unit cell, so as to obtain a particular solution, as indicated by box 1040. As indicated by box 1050, the solution of the Hermitian matrix equation is obtained, whereby one or more eigenvalues of the Helmholtz equation are calculated. In one embodiment, the eigenvalue is calculated by a finite difference calculation. The unit cell can have a symmetry element, which can be any one or more of a center of inversion, a rotation axis, and a mirror plane. Optionally, the method can include a step of accepting from a user parameters of the photonic bandgap structure, as shown by box 1060., For example, the user can control the representation of components, can adjust the unit cell, and/or can insert or can modify boundary conditions. For the convenience of the user, a graphical user interface ("GUI") is optionally provided as shown by box 1060, which GUI can be used by the user as an input mechanism. Optionally, the result of the calculation can be displayed for the user, as indicated by box 1070. The display of the result can include a photonic energy level in a Brillouin zone of the unit cell The Photonic Band Gap Simulator code was developed as part of an extensive computational investigation of the 2D metallic photonic band gap structures with application to the design of vacuum electron devices and radio-frequency accelerators. The Photonic Band Gap Simulator finite-difference code is useful to study the bulk wave propagation properties in the PBG structures. Two types of metal pole lattices, namely, square and triangular, have been considered. One can use the code to compute the dispersion characteristics for both TE and TM modes and to determine the global TE and TM band gaps. The band gap structures in metallic lattices and those in dielectric lattices are strikingly different, especially for TM modes.

The results obtained with the help of PBGSS code have been validated theoretically as well as experimentally. The results of the calculations on the global band gaps allow better understanding of the experimental results. The results of the calculations also provide useful information for future PBG cavity designs. The PBGSS code is a reliable software package that is useful for future PBG research. The result of the PBGSS calculation can be used to construct operative photonic bandgap structures, as indicated at box 1080 of FIG. 10, whether or not the results are optionally displayed to a user.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A system for designing a photonic bandgap structure, comprising:
   a modeling module representing components of a photonic bandgap structure as a linear equation corresponding to a unit cell, said linear equation represents a Helmholtz equation that models the properties exhibited by said components of said photonic bandgap structure;
   a boundary condition module representing a boundary condition for the unit cell, the boundary condition to be applied to a solution of said Helmholtz equation defined for the unit cell;
   an approximation module approximating the linear equation using a Hermitian matrix; and
   a computation module calculating an eigenvalue of the Helmholtz equation in a Hermitian matrix form for the unit cell.

2. The system of claim 1, further comprising a design module constructing a photonic bandgap structure in response to the calculated eigenvalue.

3. The system of claim 1, wherein the computation module calculates eigenvalues by calculating finite differences.

4. The system of claim 1, wherein the unit cell has a symmetry element comprising a selected one of a center of inversion, a rotation axis and a mirror plane.

5. The system of claim 1, further comprising a graphical user interface module for providing a graphic user interface for user interaction with the modeling module.

6. The system of claim 1, further comprising a display module displaying a calculated eigenvalue result to a user, the result corresponding to a photonic energy level in a Brillouin zone of the unit cell.

7. A system for designing a photonic bandgap structure, comprising:
   means for representing components of a photonic bandgap structure as a linear equation corresponding to a unit cell, said linear equation represents a Helmholtz equation that models the properties exhibited by said components of said photonic bandgap structure;
   means for representing a boundary condition for the unit cell, the boundary condition to be applied to a solution of said Helmholtz equation defined for the unit cell;
   means for approximating the linear equation using a Hermitian matrix; and
   means for calculating an eigenvalue of the Helmholtz equation in a Hermitian matrix form for the unit cell.

8. The system of claim 7, further comprising means for constructing a photonic bandgap structure in response to the calculated eigenvalue.

9. The system of claim 7, wherein the means for calculating an eigenvalue does so by calculating finite differences.

10. The system of claim 7, wherein the unit cell has a symmetry element comprising a selected one of a center of inversion, a rotation axis and a mirror plane.

11. The system of claim 7, further comprising means for providing a graphic user interface for user interaction with the means for representing components of a photonic bandgap structure.

12. The system of claim 7, further comprising means for displaying a calculated eigenvalue result to a user, the result corresponding to a photonic energy level in a Brillouin zone of the unit cell.

13. A method of designing a photonic bandgap structure, comprising the steps of:
   representing components of a photonic bandgap structure as a linear equation corresponding to a unit cell, said linear equation represents a Helmholtz equation that models the properties exhibited by said components of said photonic bandgap structure;
   representing a boundary condition for the unit cell, the boundary condition to be applied to a solution of said Helmholtz equation defined for the unit cell;
   approximating the linear equation using a Hermitian matrix corresponding to the unit cell; and
   calculating an eigenvalue of the Helmholtz equation by solving the Hermitian matrix equation.

14. The method of claim 13, wherein the step of calculating an eigenvalue comprises calculating finite differences.

15. The method of claim 13, wherein the step of representing components comprises representing components of a photonic bandgap structure as a plurality of linear equations corresponding to a unit cell having a symmetry element selected from a center of inversion, a rotation axis and a mirror plane.

16. The method of claim 13, further comprising the step of accepting from user parameters of the photonic bandgap structure using a graphic user interface.

17. The method of claim 13, further comprising the step of displaying a result of a design calculation to a user corresponding to a photonic energy level in a Brillouin zone of the unit cell.

18. A photonic bandgap structure fabricated in accordance with the result of the method of claim 13.

* * * * *

UNITED STATES PATENT AND TRADEMARK OFFICE
CERTIFICATE OF CORRECTION

PATENT NO. : 7,117,133 B2  
APPLICATION NO. : 10/171725  
DATED : October 3, 2006  
INVENTOR(S) : Chen et al.

Page 1 of 1

It is certified that error appears in the above-identified patent and that said Letters Patent is hereby corrected as shown below:

IN THE SPECIFICATION:

Please replace the following sponsorship information at column 1, lines 20-25;

This invention was made with government support under Grant Nos. F49620-00-1-007 and 99RA0734-01 awarded by the Air Force, and Grant No. DE-FG02-95ER40919 awarded by the DOE. The government has certain rights in this invention.

Signed and Sealed this
Fourteenth Day of June, 2011

David J. Kappos
*Director of the United States Patent and Trademark Office*